US012635079B2

(12) United States Patent
    Hendriks

(10) Patent No.: US 12,635,079 B2
(45) Date of Patent: May 19, 2026

(54) DONOR PLATE, DEPOSITION DEVICE AND DEPOSITION METHOD

(71) Applicant: Nederlandse Organisatie voor toegepast-natuurwetenschappelijk onderzoek TNO, 's-Gravenhage (NL)

(72) Inventor: Rob Jacob Hendriks, Waalre (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 390 days.

(21) Appl. No.: 18/274,618

(22) PCT Filed: Jan. 31, 2022

(86) PCT No.: PCT/NL2022/050043
    § 371 (c)(1),
    (2) Date: Jul. 27, 2023

(87) PCT Pub. No.: WO2022/164320
    PCT Pub. Date: Aug. 4, 2022

(65) Prior Publication Data
    US 2024/0314935 A1      Sep. 19, 2024

(30) Foreign Application Priority Data
    Feb. 1, 2021    (EP) .................................... 21154587

(51) Int. Cl.
    *H05K 3/12*           (2006.01)
(52) U.S. Cl.
    CPC ... *H05K 3/1258* (2013.01); *H05K 2203/0113* (2013.01); *H05K 2203/1115* (2013.01)
(58) Field of Classification Search
    None
    See application file for complete search history.

(56) References Cited

U.S. PATENT DOCUMENTS

| | | | |
|---|---|---|---|
| 6,140,009 A | 10/2000 | Wolk et al. | |
| 7,396,566 B2 | 7/2008 | Zschieschang et al. | |

(Continued)

FOREIGN PATENT DOCUMENTS

| | | | | |
|---|---|---|---|---|
| EP | 3911130 A1 | * | 11/2021 | ........... H05K 3/1258 |
| EP | 4586308 A1 | * | 7/2025 | ....... H01L 21/67144 |

(Continued)

OTHER PUBLICATIONS

Korean Patent Office, Reasons for Rejection in corresponding Korean Patent Application No. 10-2023-7028044 dated Sep. 2, 2025.

(Continued)

*Primary Examiner* — David P Turocy
(74) *Attorney, Agent, or Firm* — Leydig, Voit & Mayer, Ltd.

(57)           ABSTRACT

A donor plate for deposition of a deposition substance on a target is disclosed herein. The donor plate includes a flexible substrate, which at a first main surface of the flexible substrate has, in sequential order, further layers in the form of: an electrode layer, a first electrically insulating layer, a resistive heater layer, a second electrically insulating layer and a patterned layer provided with one or more recesses for holding deposition substance to be deposited on the target. The electrode layer comprises a first and a second electrode of a complementary shape and being electrically insulated from each other. The resistive heater layer is electrically connected to each of a contact surface of the first electrode and a contact surface of the second electrode via at least one respective slit in the first electrically insulating layer.

20 Claims, 10 Drawing Sheets

(56) References Cited

U.S. PATENT DOCUMENTS

| 12,414,241 | B2 * | 9/2025 | Hendriks | ............... | H05K 3/046 |
| 2009/0142510 | A1 * | 6/2009 | Takahashi | .............. | H10K 71/18 |
| | | | | | 427/557 |
| 2010/0118243 | A1 * | 5/2010 | Majumdar | ............. | H05K 3/046 |
| | | | | | 428/323 |
| 2017/0013724 | A1 | 1/2017 | Noy | | |

FOREIGN PATENT DOCUMENTS

| JP | 61254350 | A | | 11/1986 |
| JP | 2002534782 | A | | 10/2002 |
| JP | 2009152187 | A | | 7/2009 |
| JP | 2016114914 | A | * | 6/2016 |
| KR | 1020090056920 | A | | 6/2009 |
| KR | 1020200091429 | A | | 7/2020 |

OTHER PUBLICATIONS

European Patent Office, Examination report in corresponding European Patent Application No. 22702799.2 dated Aug. 23, 2024.
European Patent Office, International Search Report in corresponding International Application No. PCT/NL2022/050043, dated May 12, 2022 (5 pages).
Japanese Patent Office, Office Action in corresponding Japanese Patent Application No. 2023-546316 dated Feb. 24, 2026.

* cited by examiner $$l_1^2 * \Omega/\square_1 = l_2^2 * \Omega/\square_2$$

| | Thickness (µm) | Density (kg/m3) | Specific Heat (J/kgK) | Thermal conductivity (W/mK) |
|---|---|---|---|---|
| Ink | 5 | 4000 | 300 | 0.4 |
| W | 1 | 19300 | 134 | 173 |
| Si3N4 | Variable | 3170 | 673 | 3 |
| Mo | 0.13 | 10280 | 250 | 142 |
| SiO2 | 1 | 2300 | 680 | 1.1 |
| Cu | 50 | 8960 | 385 | 386 |
| Si | 300 | 2330 | 710 | 148 |

DONOR PLATE, DEPOSITION DEVICE AND DEPOSITION METHOD

CROSS-REFERENCE TO RELATED APPLICATIONS

This patent application is a U.S. National Phase of PCT International Application No. PCT/NL2022/050043, filed Jan. 31, 2022, which claims priority to European Application No. 21154587.6, filed Feb. 1, 2021, which are both expressly incorporated by reference in their entireties, including any references contained therein.

BACKGROUND

The present invention pertains to a donor plate for deposition of a deposition substance on a target.

The present invention further pertains to a deposition device comprising the donor plate.

The present invention still further pertains to a method of depositing using a donor plate.

The present invention also pertains to a record carrier comprising a computer program that causes a programmable device to perform said method.

Deposition methods are known, wherein a deposition substance to be deposited is ejected from recesses in a surface of a donor plate onto a surface of a target. US20170013724 for example discloses a tracks pattern production apparatus that transfers a filler contained in trenches of a donor substrate to a receptor object. A scanning laser is proposed therein to induce a thermal transfer of the filler. A lateral position where the transferred filler is deposited on the receptor object does not only depend on a lateral position of the trench from which it originates, but also depends on a transfer direction in which the filler leaves the trench upon its ejection. In practice it is sometimes difficult to accurately control the transfer direction, so that lateral deviations occur in the deposition location. Accordingly, there is a need to provide means that enable a more accurate control of the deposition location.

Other deposition methods are suggested as illustrated in FIG. 1. Instead of using a scanning laser, resistive heating is applied to induce heat for causing ejection of the filler, e.g. a functional ink. In the example shown in FIG. 1, an anode and a cathode are provided as busbars that are embedded in a wafer, serving as a carrier and the resistive heater is provided as a resistive layer with respective resistive layer sections that extend between a pair of busbars of mutually opposite polarity. The filler is provided in cavities in an insulating layer deposited on a side of the carrier provided with the resistive layer. Upon providing electric energy the resistive layer sections

SUMMARY

According to a first aspect a donor plate for deposition of a deposition substance on a target, is provided as claimed in claim 1.

The donor plate comprises a flexible substrate, which at a first main surface subsequently has an electrode layer, a first electrically insulating layer, a resistive heater layer, a second electrically insulating layer and a patterned layer provided with one or more recesses for holding deposition substance to be deposited on the target.

The electrode layer comprises a first and a second electrode of a complementary shape and that are electrically insulated from each other, and the resistive heater layer is electrically connected to each of a contact surface of the first electrode and a contact surface of the second electrode via at least one respective slit in the first electrically insulating layer.

Upon supplying electric energy to the resistive heater layer the heat developed therein causes the flexible substrate to deform so that the patterned layer moves towards the target. Consequently a gap between the patterned layer and the target, and therewith deviations in the deposition location due to deviations in the transfer direction are reduced.

The deposition substance to be deposited is a viscous material. The viscosity is typically at least 50 Pa·s (to avoid undesired deformation). In some cases the viscosity is in the order of 1000 Pa·s. Exemplary deposition substances are an electrically conductive material, such as an electroconductive polymer, a metallized polymer, a solder paste, conductive adhesive, an electrically insulating material, such as an electrically insulating polymer, a semi-conductive material, such as a semi-conductive polymer. Alternatively, or additionally a deposition substance, whether electrically conductive, semi-conductive or insulating may serve as a thermal insulator or instead as a thermal conductor.

Additional elements, other than those mentioned above, may be present. For example, a heat spreader layer may be provided between the second electrically insulating layer and the patterned layer in areas with a recession to contribute to a further improvement of a heat flux towards the deposition substance therein. In exemplary embodiments the patterned layer is of a thermally insulating material. The recesses form interruptions therein to enable an efficient heat flow from the resistive heater layer towards the deposition substance.

In an embodiment, at each position of the resistive heater layer a smallest distance between the at least one slit of the first electrode and the least one slit of the second electrode is at most one tenth of the square root of an effective surface area of the resistive heater layer. The effective surface area of the resistive heater layer referred to herein is the area of the resistive heater layer being electrically connected with both electrodes. With this measure it is achieved that electric power for heating the resistive heater layer can be supplied with a comparatively low supply voltage. The lower supply voltage enables a thinner implementation of the first electrically insulating layer. The lower supply voltage furthermore allows for a reduction of the electrode separation. As a result the electrode layer can serve as an efficient and substantially homogeneous heat sink. Therewith the donor plate can rapidly cool down to restore its original shape. As a result, the donor plate can retract away from the target surface, before deposited deposition substance has an opportunity to solidify and adhere to the donor plate.

In examples of this embodiment, the first and the second electrode are comb-shaped, having respective sets of comb fingers wherein the comb fingers of the first electrode and the comb fingers of the second electrode are interleaved. At least one slit of the first electrode comprises a respective slit for each comb finger of the first electrode and the at least one slit of the second electrode comprises a respective slit for each comb finger of the second electrode. The respective slits in the first electrically insulating layer extend in a longitudinal direction of the comb fingers over their respective contact surface. Whereas typically, the distance $l$ between the slits is constant and the thickness $d$ of the resistive heater layer is uniform, this is not essential. Variations therein are allowable, provided that the product of the square of the distance $l$ and the sheet resistance is constant.

In other examples, the first and the second electrode extend alongside each other according to a spiral trajectory. The at least a first slit longitudinally extends over the contact surface of the first electrode and the at least a second slit longitudinally extends over the contact surface of the second electrode.

Some embodiments of the donor plate, additionally comprise respective, independently controllable sets of one or more resistive heating elements arranged between the second electrically insulating layer and the patterned layer in respective zones defined by respective ones of the recesses. The independently controllable sets of one or more resistive heating elements render it possible to independently control the ejection of deposition substance from the recesses. Therewith a point in time of ejection of the deposition substance from the recesses can be independently selected from the point in time at which the resistive heater layer is powered. Therewith it is possible to control a speed with which the ejected deposition substance arrives at the target. In examples thereof, at least one independently controllable set of one or more resistive heating elements comprises at least two independently controllable resistive heating elements. Through independently controlling the at least two independently controllable resistive heating elements, a distribution of forces exerted on the deposition substance to be ejected from the recess can be adapted to the morphology of the target surface. Also this enables an additional way of controlling of a shape in which the deposition substance will solidify on the target surface.

According to a second aspect a deposition device is provided as claimed in claim 7. The deposition device, comprising the donor plate according to one of the embodiments or specific examples thereof specified above, and further comprises a plate carrier. The donor plate is laterally attached at a second main surface opposite its first main surface to a first plate carrier surface of the plate carrier. The plate carrier serves as a holder for the donor plate. As the flexible substrate is attached to the donor plate carrier only at its periphery, the donor plate is free to deform as a result of thermal expansion within the constraints defined by the attachment at its periphery. In an example thereof, the plate carrier is mounted to a reference frame at a first side and at a second side opposite the first side is slidably coupled to the reference frame with a linear slide to allow the plate carrier to expand in a direction along an axis from said first side to said second side. Although the plate carrier is not directly heated, it may be subject to temperature variations due to heat induced in the donor plate. In this way deformation of the plate carrier due to such temperature variations can be avoided. If a very high deposition accuracy is required it may be contemplated to adapt the design of the pattern for compensation of a shift of the pattern elements in the lateral direction due to said sliding. The expected shift, and therewith the proper adaptation can be computed relatively easily for example by a simulation. Alternatively or additionally it may be contemplated to measure the locations of deposited material at the target and from these observations to design an improved pattern for the donor plate.

In an embodiment of the deposition device the donor plate is fixed to the plate carrier with a round going seal. In an example thereof the plate carrier has one or more channels that extend through the plate carrier that are configured to be coupled to a pressure control unit. The donor plate may be attached to the plate carrier in a pre-tensioned manner, so that in a standby mode of the deposition device, preceding a deposition mode, the donor plate is held flat against the plate carrier surface. This implies however that a relatively high supply power is necessary to sufficiently deform the donor plate as the pre-tension must be compensated. In this embodiment it is not necessary that the donor plate is attached with pretension. In the standby mode the pressure control unit is configured to apply a vacuum in the middle of the donor plate, so that it is firmly held flat against the plate carrier. During plate deformation, the vacuum seal should be broken automatically. This can be achieved in that the deformation of the plate results in a temporary opening therein that allows air to pass through, so as to cancel the vacuum.

In an embodiment of the deposition device one or more spacers are provided at a free surface of the patterned layer. The spacers contribute in maintaining a stable reference distance between the donor plate and the target.

In an embodiment of the deposition device, the donor plate in a radially outward direction has a central section, a resistively heatable intermediary section and a peripheral section. Therein the central section comprises a section of the flexible substrate, with the electrode layer, the first electrically insulating layer, the resistive heater layer, the second electrically insulating layer and the patterned layer. The intermediate section surrounds the central section and the donor plate is attached with its peripheral section to the plate carrier. By resistively heating the intermediary section, the central section of the donor plate can be translated towards the target without substantial deformation. In examples of this embodiment the intermediary section has a thermal expansion coefficient greater than that of the central section. This can be achieved in that the substrate is locally modified.

Therewith a substantial deformation of the intermediary section can be achieved.

In an example, the intermediary section of a sectioned plate as described above may comprise a plurality of heating layers. Therewith a relatively large heat flux can be induced to achieve a substantial deformation of the intermediate section.

In an example, the central section of a sectioned plate as described above comprises a further resistive heater layer wherein the resistive heater layer and the further resistive heater layer are arranged at opposite sides of a virtual central plane of the central section. In this example, one of the resistive heater layers that is arranged closer towards the patterned layer is heated to induce an ejection of the deposition substance. The other one of the resistive heater layers that is closer to the plate carrier is heated to minimize a temperature gradient in a thickness direction of the central section, so that a deformation of the central section is mitigated.

In an example of a sectioned plate as described above, a thickness of the central section increases in a radially outward direction. As a result, also the thermal equilibration time increases in the radially outward direction. Consequently the thermal expansion will be relatively high for radially outward positions of the donor plate as compared to more radially inward positions. Therewith a bending of the donor plate can be compensated to keep the donor plate flat in the printing area. A radially outward increasing thickness may be provided for example in that the thickness of the flexible substrate increases in that direction, or in that the flexible substrate is provided with a coating at the side facing the plate carrier with such a thickness profile.

According to a third aspect a deposition method is provided as claimed in claim 16. The method of depositing specified therein uses a donor plate comprising a flexible substrate, which at a first main surface subsequently has an electrode layer, a first electrically insulating layer, a resistive heater layer, a second electrically insulating layer and a patterned layer provided with one or more recesses for holding a deposition substance to be deposited on a target, wherein the electrode layer comprises a first and a second electrode of a complementary shape and being electrically insulated from each other, and wherein the resistive heater layer is electrically connected to each of the first electrode and the second electrode via at least one respective slit in the first electrically insulating layer.

A method according to the third aspect as claimed in claim 16 comprises:

positioning the donor plate with its patterned layer in a non-contacting manner in front of the target;

substantially uniformly heating the donor plate with the resistive heater layer to therewith deform the donor plate as a result of thermal expansion to cause the patterned layer to move towards the target;

ejecting the deposition substance to be deposited from the recesses onto the target;

cooling down the donor plate to remove the patterned layer away from the target.

As the donor plate moves to the target, when it is heated, and therewith optionally contacts the target, a printing gap is reduced. Therewith a printing accuracy is improved.

It is noted that the step of uniformly heating the donor plate may at the same time sufficiently heat the deposition substance to result in an ejection thereof.

In an embodiment of the method according to the third aspect, the donor plate has respective, independently controllable sets of one or more resistive heating elements arranged between the second electrically insulating layer and the patterned layer in respective zones defined by respective ones of the recesses, and wherein the method further comprises independently controlling the step of ejecting by providing electric energy to said respective, independently controllable sets of one or more resistive heating elements. In this embodiment, ejection of the deposition substance can be controlled to take place in a particular state of the donor plate therewith rendering it possible to control the velocity with which a deposition is propelled towards the target.

Steps of the method may be carried out by a programmable processor for example to control a providing of electrical energy to the resistive heater layer and/or to independently controllable sets of one or more resistive heating elements. To that end, a computer program product may be provided that comprises a computer program, which when executed by a programmable processor causes the programmable processor to carry out such steps of the method.

BRIEF DESCRIPTION OF THE DRAWINGS

These and other aspects are described in more detail with reference to the drawing. Therein.

DETAILED DESCRIPTION OF EMBODIMENTS

Like reference symbols in the various drawings indicate like elements unless otherwise indicated.

Figures 1A, 1B:
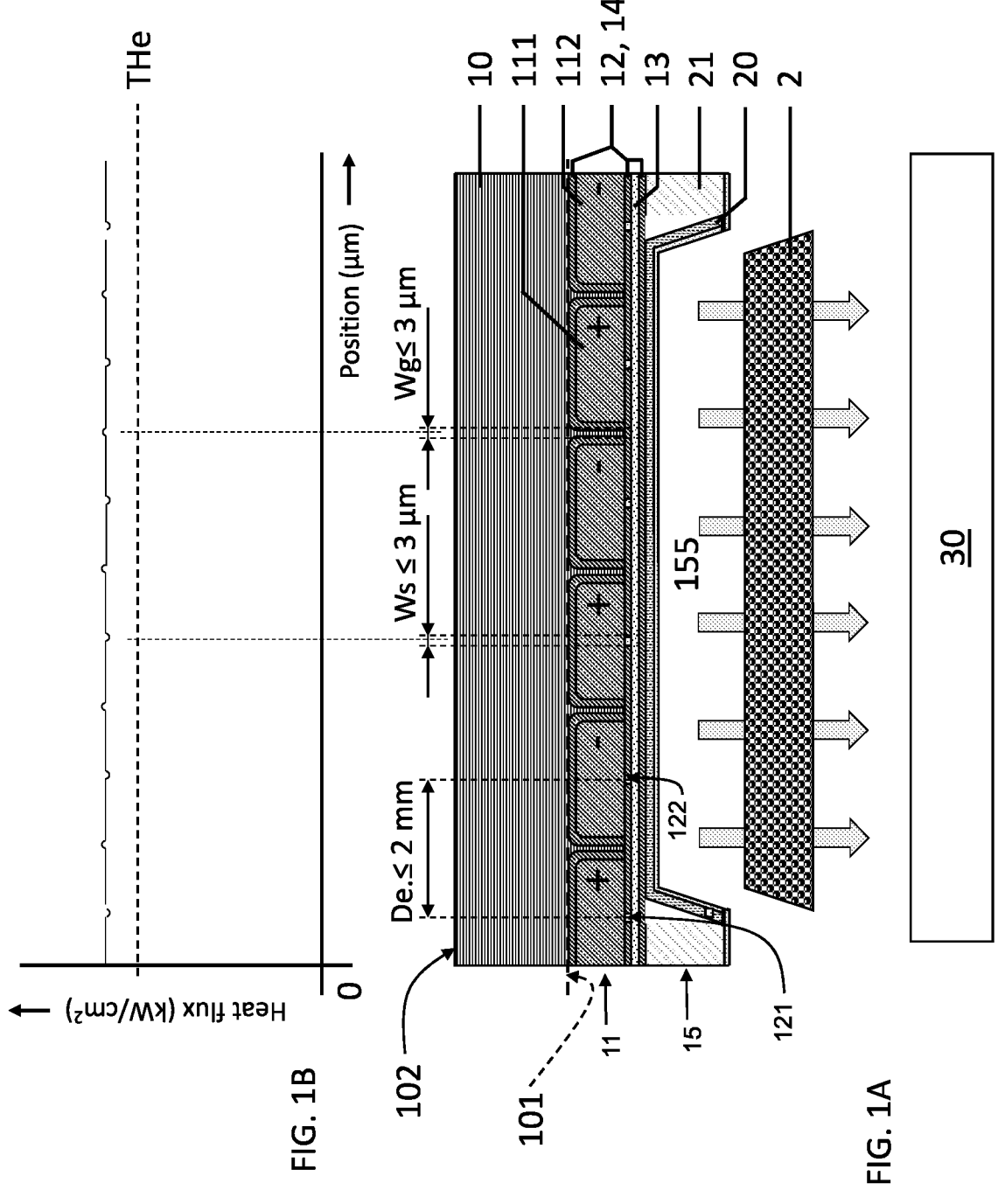
FIG. 1A schematically shows an embodiment of a donor plate according to the invention for deposition of a deposition substance on a target.
FIG. 1B shows a heatflux as measured as a function of a position.

FIG. 1A schematically shows an embodiment of a donor plate 1 for deposition of a deposition substance 2 on a target 30. The donor plate comprises a flexible substrate 10, e.g. a silicon substrate, which at a first main surface 101 subsequently has an electrode layer 11, a first electrically insulating layer 12, a resistive heater layer 13, a second electrically insulating layer 14 and a patterned layer 15 provided with one or more recesses 155 for holding deposition substance 2 to be deposited on the target. The patterned layer 15 may comprise a thermal insulator layer 21 to reduce a heat flux outside the areas defined by the recesses. The electrode layer 11 comprises a first and a second electrode 111, 112 which are of a complementary shape and which are electrically insulated from each other by a gap 113. The gap may be provided as free space or may be filled with an insulating material. For example, the material of the carrier. In an example, a width Wg of the gap is less than 10 micron, e.g. less than 3 micron. The resistive heater layer 13 is electrically connected to each of a contact surface of the first electrode 111 and a contact surface of the second electrode 112 via at least one respective slit 121, 122 in the first electrically insulating layer. In the example shown, the slits have a width Ws of less than 3 micron.

Figure 2:
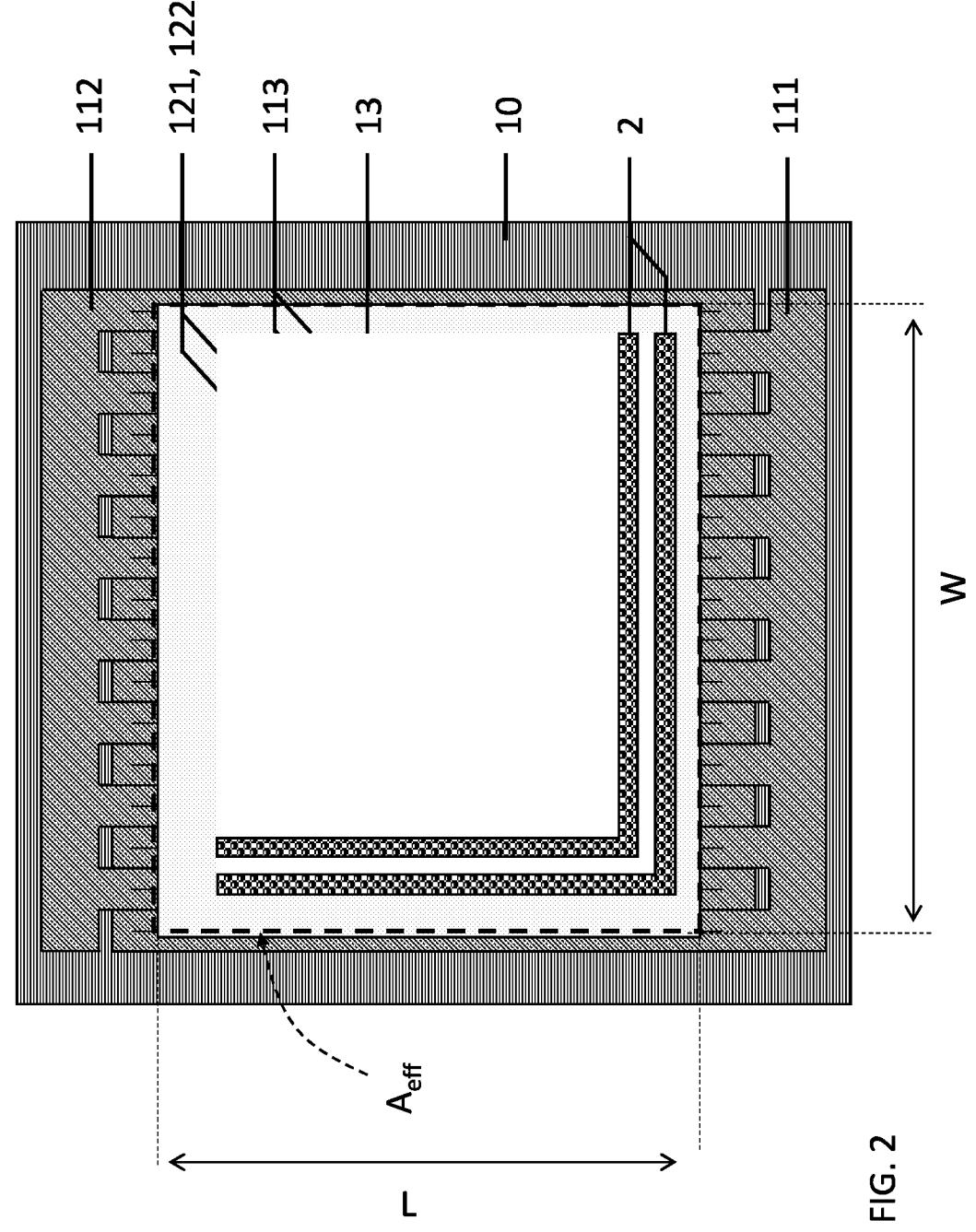
FIG. 2 shows a top view of the donor plate of FIG. 1A.

FIG. 2 shows a top view of the plate as seen in a direction away from the target surface 30.

In the embodiment of FIG. 2 the first and the second electrode 111, 112 are comb-shaped. Each of the electrodes has a respective sets of comb fingers 1111, 1121. As can be seen in FIG. 2, the comb fingers 1111 of the first electrode 111 and the comb fingers 1121 of the second electrode 112 are interleaved. The at least one slit 121 of the first electrode 111 comprises a respective slit for each comb finger 1111 of the first electrode 111 and the at least one slit 122 of the second electrode 112 comprises a respective slit for each comb finger 1121 of the second electrode 112. The slits in the first electrically insulating layer 12 extend in a longitudinal direction of the comb fingers over their respective contact surface 1112, 1122. In the example shown in FIG. 2, the distance De between the slits is smaller than about 2 mm.

In the example shown in FIGS. 1A and 2, at each position of the resistive heater layer 13 the smallest distance De between the at least one slit 121 of the first electrode 111 and the least one slit 122 of the second electrode 112 is at most one tenth of the square root of an effective surface area $A_{eff}$ of the resistive heater layer 13. The effective surface area $A_{eff}$ of the resistive heater layer 13 referred to herein is the area of the resistive heater layer that is electrically connected with both electrodes. In the example shown, the effective surface area $A_{eff}$ is equal to the product of a length L and a width W of the resistive heater layer 13 that is in electric contact with the electrodes 111, 112.

By way of example, the values for the length L and the width W may both be 3 cm, and therewith the distance De between the slits is less than one tenth of the square root of the effective surface area $A_{eff}$ of the resistive heater layer.

In operation an electric voltage is applied between the electrodes 111, 112, to resistively heat the deposition substance 2 provided in the recesses 155 in the patterned layer 15. FIG. 1B shows a heatflux as measured as a function of a position in a direction from left to right along a surface of the resistive heater layer 13 facing the patterned layer 15 As shown in FIG. 1B, the arrangement of the resistive heater layer of FIGS. 1A and 2 provides for a very homogeneous heat flow, so that the deposition substance is ejected with a uniform ejection velocity within a recess 155. Only minor variations occur. I.e. at the location of the slit 122 small dips occur in the heatflux towards the patterned layer. This is due to the fact that part of the heat flows towards the electrodes 111, 112 as the electrical connection formed therein between the electrodes and the resistive heater layer 13 also provides a thermal connection. It can be seen however in FIG. 1B that this effect is minimal due to the small width of the slits. Also, local spikes in the heat flux towards patterned layer can be observed which are due to a lower heat sink effect in the gaps between neighboring electrodes. I.e. the electrodes 111, 112 typically being of a metal generally have a relatively high conductivity whereas electrically insulating materials, e.g. as SiO2 or SiN generally have a lower thermally conductivity. As can be seen in FIG. 1B also the spikes are modest, due to the relatively small width Wg of the gaps between electrodes. As a further measure, a heat spreader layer 20, being of a material with a high thermal conductivity is provided at a bottom of the recesses 155 that further contributes to a uniform distribution of the heatflux towards the patterned layer 15. FIG. 1B shows that the magnitude of the heatflux is slightly above the threshold heatflux The required to eject the deposition substance 2 out of the recesses.

Figure 1C:
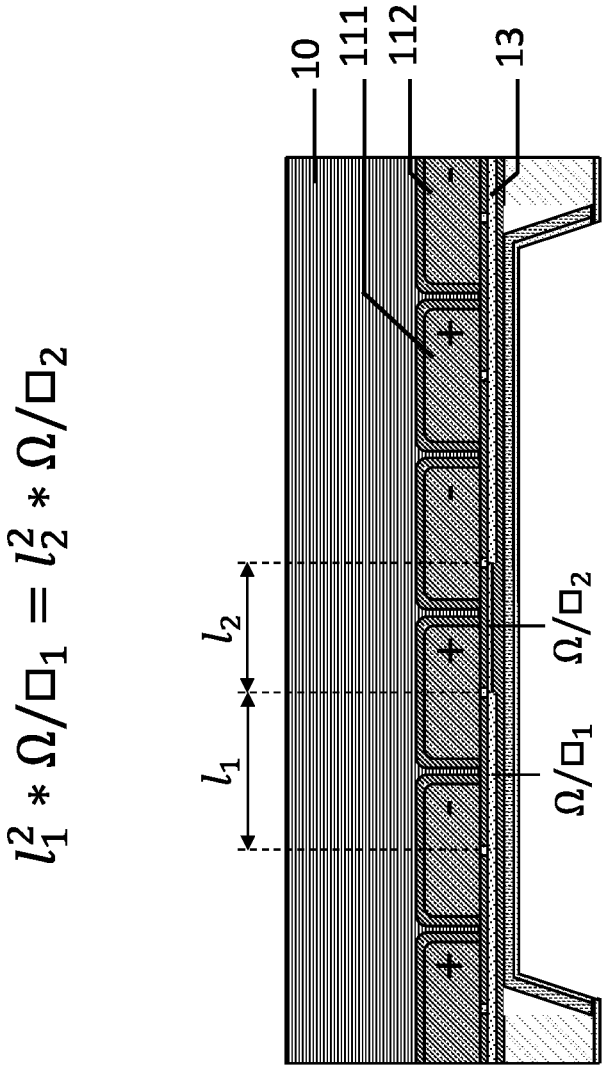
FIG. 1C shows another embodiment of a donor plate according to the invention.

With reference to FIG. 1C, it is noted that it is not essential that the distance between mutually subsequent slits is the same for the full area of the plate. For example, a first pair of subsequent slits may have a distance $l_1$ and a second pair of subsequent slits may have a different distance $l_2$, such that:

$$l_1^2 * \Omega/\square_1 = l_2^2 * \Omega/\square_2$$

Therein $\Omega/\square_1$ and $\Omega/\square_2$ are the sheet resistance of a portion of the resistive heater layer 13 between the first pair of subsequent slits and between the second pair of subsequent slits respectively. The portions may have a mutually different sheet resistance by an appropriate selection of the resistive material for the resistive heater layer portions or by an appropriate selection of their thicknesses.

Figures 3A, 3B, 3C:
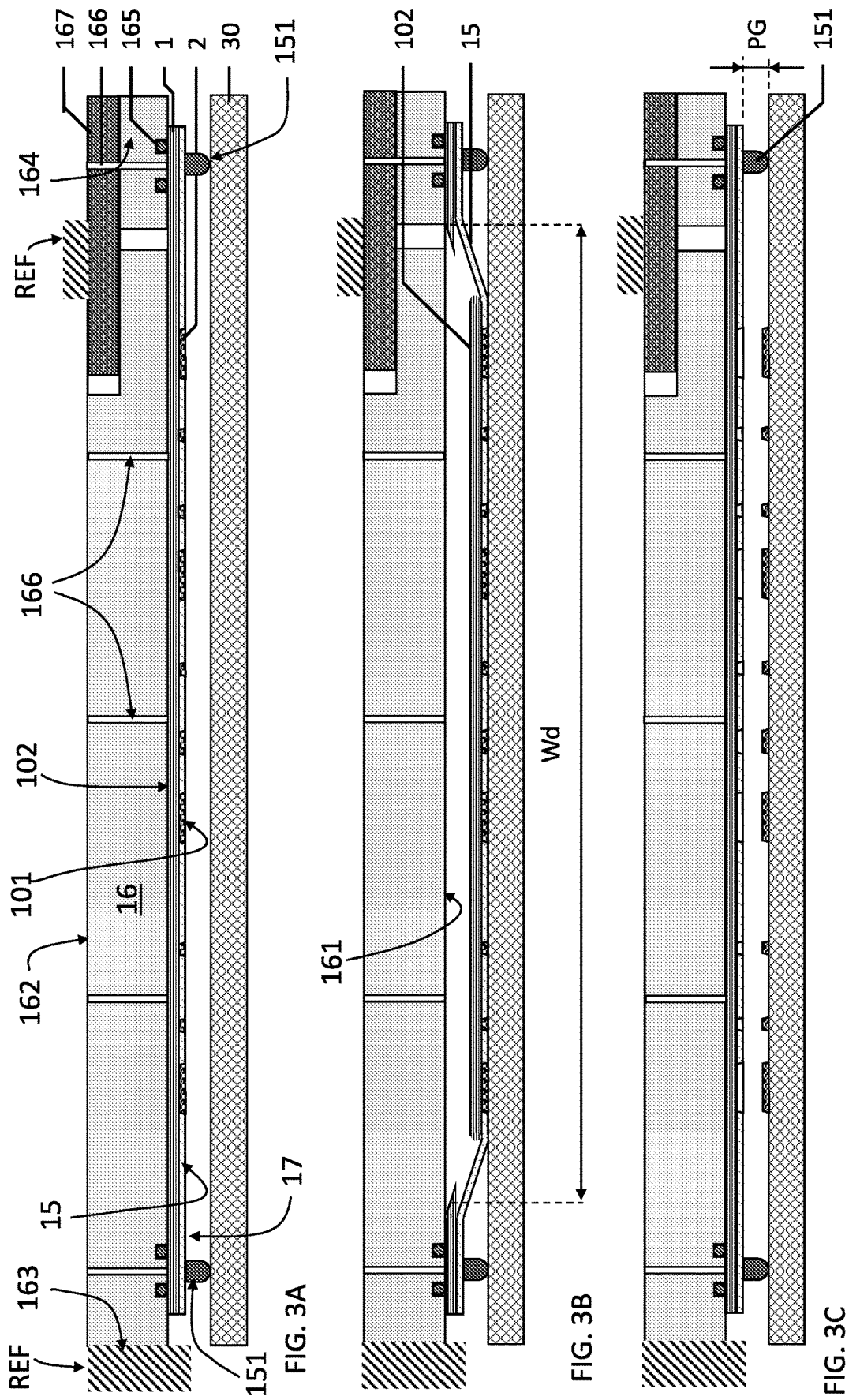
FIGS. 3A, 3B and 3C schematically shows three operational stages of a deposition device comprising an embodiment of a donor plate according to the invention.

FIGS. 3A, 3B and 3C schematically shows three operational stages of a deposition device. Referring for example to FIG. 3A, which shows the deposition device in an initial operational state, the deposition device comprises a donor plate 1 and a plate carrier 16. The donor plate 1 is laterally attached at a second main surface 102 opposite its first main surface 101 to a first plate carrier surface 161 of the plate carrier 16.

The plate carrier 16 is mounted to a reference frame REF at a first side 163. At a second side 164 opposite the first side it is slidably coupled to the reference frame to allow the plate carrier 16 to expand in a direction along an axis from the first side to the second side.

As is further shown in FIG. 3A, the donor plate 1 is fixed to the plate carrier 16 with a round going seal 165 and the plate carrier has one or more channels 166 extending through the plate carrier, which channels 166 are configured to be coupled to a pressure control unit.

The deposition device shown in this example comprises one or more spacers 151 at a free surface 17 of the patterned layer 15.

A deposition method using the deposition device is now described for the three operational stages shown in FIGS. 3A, 3B and 3C. In the first stage S1 shown in FIG. 3A, the donor plate 1 is positioned with its patterned layer 15 in a non-contacting manner in front of the target 30. It can be seen that the spacers 151 therewith maintain a predetermined distance of the patterned layer 15 to the target surface. Alternatively a servo system may be used to achieve a proper positioning. In the first stage the donor plate typically has a temperature equal to roomtemperature, e.g. about 20° C.

As shown in FIG. 3B, in a subsequent step S2, an electric voltage is applied to the resistive heater layer 13 of the donor plate to therewith heat the donor plate in a substantially uniform manner. Therewith, the first main surface 101, which is closer to the patterned surface is heated more rapidly than the second main surface 102, facing the plate carrier 16 a substantial temperature difference is caused. For example, while the second main surface 102 still has a temperature close to room temperature, the first main surface 101 may rapidly achieve, for example within 5 to 15 microsecond, a substantially higher temperature in the order of magnitude of a few hundred degrees, e.g. 500° C. As a result the donor plate is deformed over a width Wd until the patterned layer 15 contacts the target. At that point in time, the deposition substance is ejected in step S3 to be deposited from the recesses 151 onto the target. As in this stage the patterned layer 15 contacts the target, the traveling distance for the deposition substance is substantially zero, so that lateral deviations in the deposition location are minimized.

As shown in FIG. 3C, subsequently in step S4, the donor plate is cooled down so that the patterned layer 15 is retracted away from the target. Also the retraction can take place rapidly, for example in 20 to 40 microseconds, e.g. in a time frame of 30 microseconds the plate is cooled down to a uniform temperature of a few tens of degrees e.g. 40° C. and fully retracted to the plate carrier 16.

In the embodiment just described the ejection of the deposition substance 2 is initiated by the step of resistively heating.

Figures 4A, 4B:
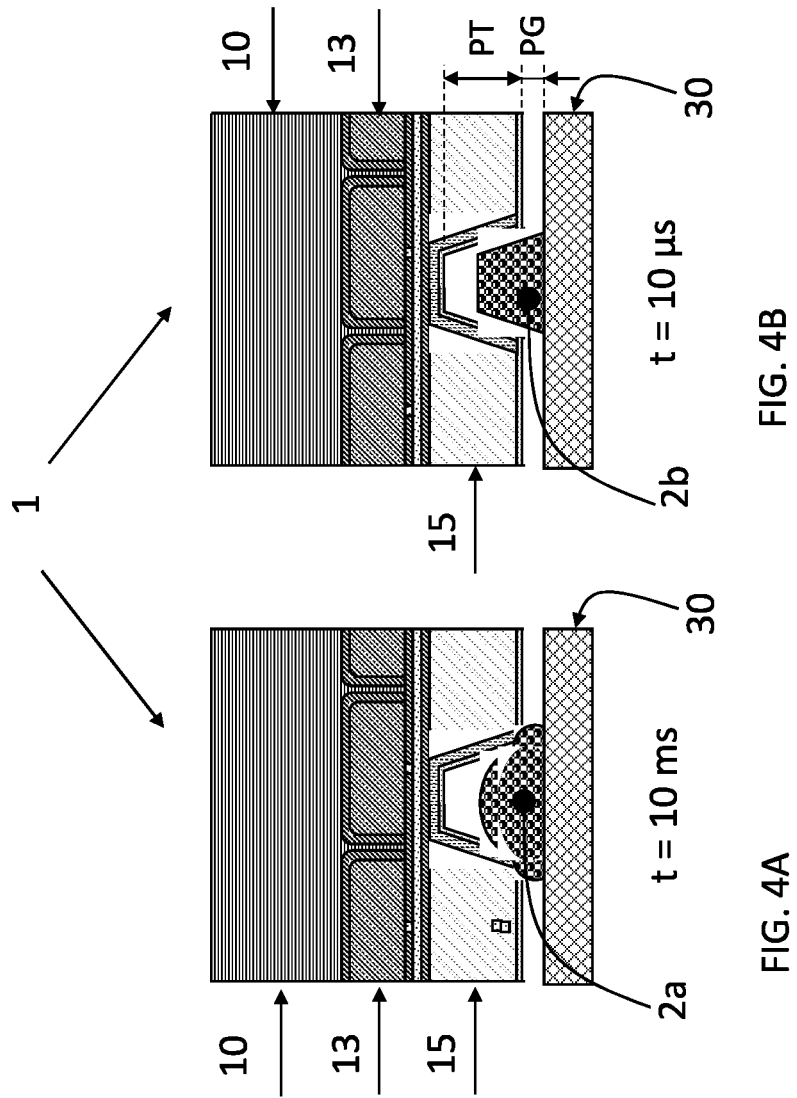
FIGS. 4A, 4B, show an operation stage in an embodiment of a deposition device not according to the invention and an embodiment of a deposition device according to the invention respectively.

As illustrated in FIG. 4A, 4B, the rapid retraction of the donor plate 1 contributes to a better release of the deposition substance 2. In the examples shown the donor plate 1 has retracted away from the target 30 over a distance PG. The distance PG maybe a fraction of the print thickness PT, i.e. the dept of the recesses in the patterned surface of the plate, e.g. PG is about ⅓ to ½ of the print thickness PT. In the example shown in FIG. 4A, retraction is relatively slow, e.g. has taken a few milliseconds, e.g. 10 milliseconds. In this timeframe the deposition substance 2a, could flow out, therewith contact the edges of the recess from which it was ejected, and stick thereto after solidification.

FIG. 4B shows the situation wherein retraction has taken place in a few microseconds to a few tens of microseconds, e.g. in 10 microseconds. In this timeframe the deposition substance 2b does not have sufficient time to flow out, so that is avoided that it sticks to the donor plate after ejection.

Figure 5:
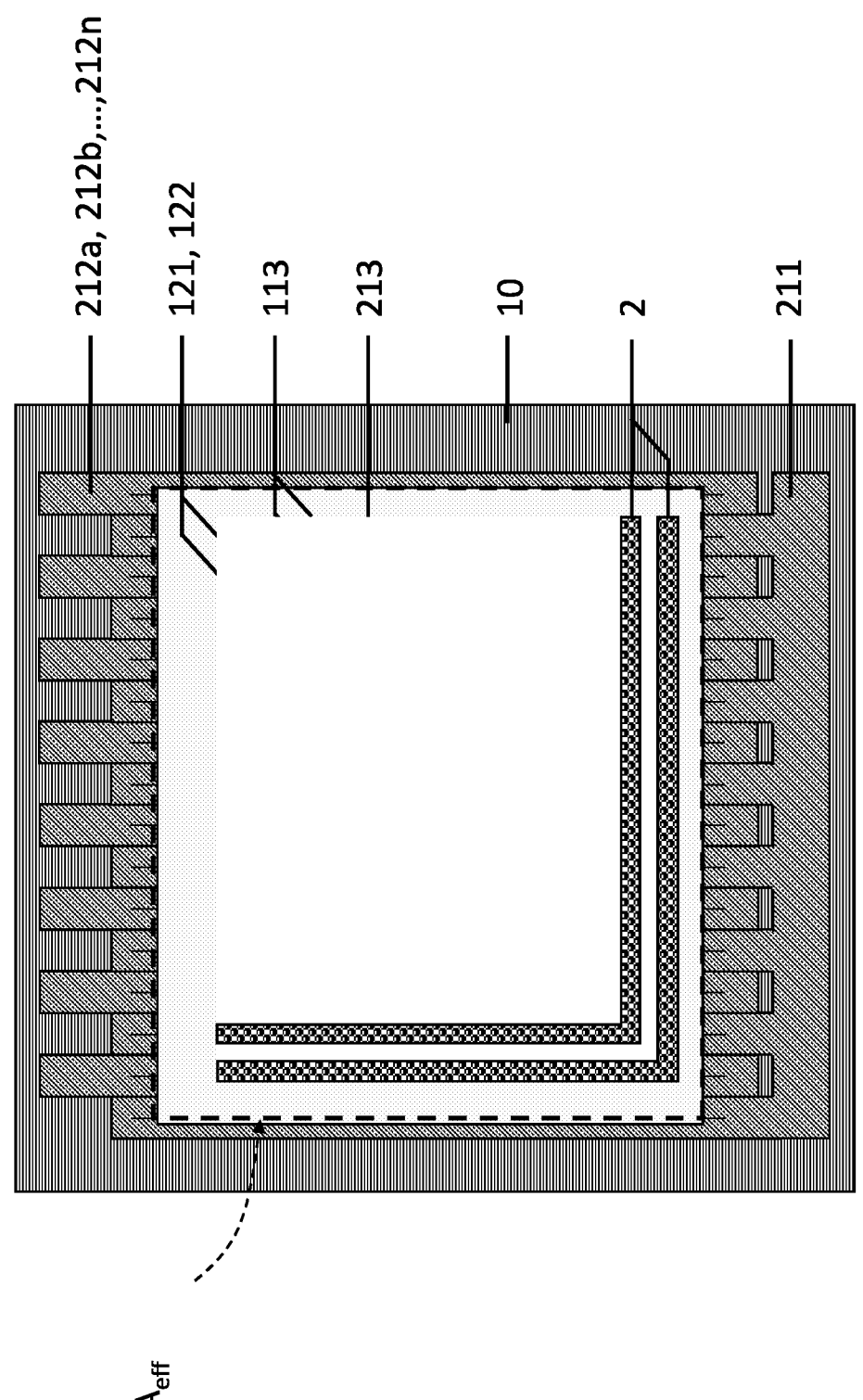
FIG. 5 shows an alternative embodiment of a donor plate according to the invention.

In an alternative embodiment a donor plate as shown in FIG. 5 is used that has respective, independently controllable sets of one or more resistive heating elements arranged between the second electrically insulating layer 14 and the patterned layer 15 in respective zones defined by respective ones of the recesses. In operation the donor plate may be heated in step S2 at its first main surface 101 to a temperature that is sufficiently high to deform the plate, and in step S3, the ejection of deposition substance 2 can be accurately controlled by selectively providing electric energy to a specific selected control electrode 212a, 212b, . . . 212n of a set of one or more dedicated resistive heating elements. The resistive heating elements may share a common second electrode 211. Therewith the timing of the ejection can be controlled independently from the timing of the deformation of the plate.

In the embodiment, ejection of the deposition substance 2 can be controlled to take place in a particular state of the donor plate 1.

As an example, the velocity with which the deposition substance 2 is ejected in step S3 can be increased by timing the ejection when the donor plate 1 is moving towards the target 30. Suppose for example, that the velocity of the donor plate 1 in the direction of the target 30 induced in step S2 as a result of its thermal expansion is 10 m/s and that the deposition substance 2 is ejected from the donor plate 1 with a velocity of 10 m/s by energizing one or more of the dedicated resistive heating elements, then the deposition substance 2 will be transferred with a velocity of 20 m/s towards the target 30.

The opposite would be possible too. If the deposition substance 2 is ejected at 10 m/s while the donor plate 1 is retracting at 10 m/s then the resulting velocity is 0 m/s, which makes gravity causing the deposition substance to fall onto the target 30. This reduced impact speed could be beneficial for preventing lower viscous deposition substances to splash, or making it possible to wrap ink around surfaces without breaking up due to high shear forces.

Figure 6:
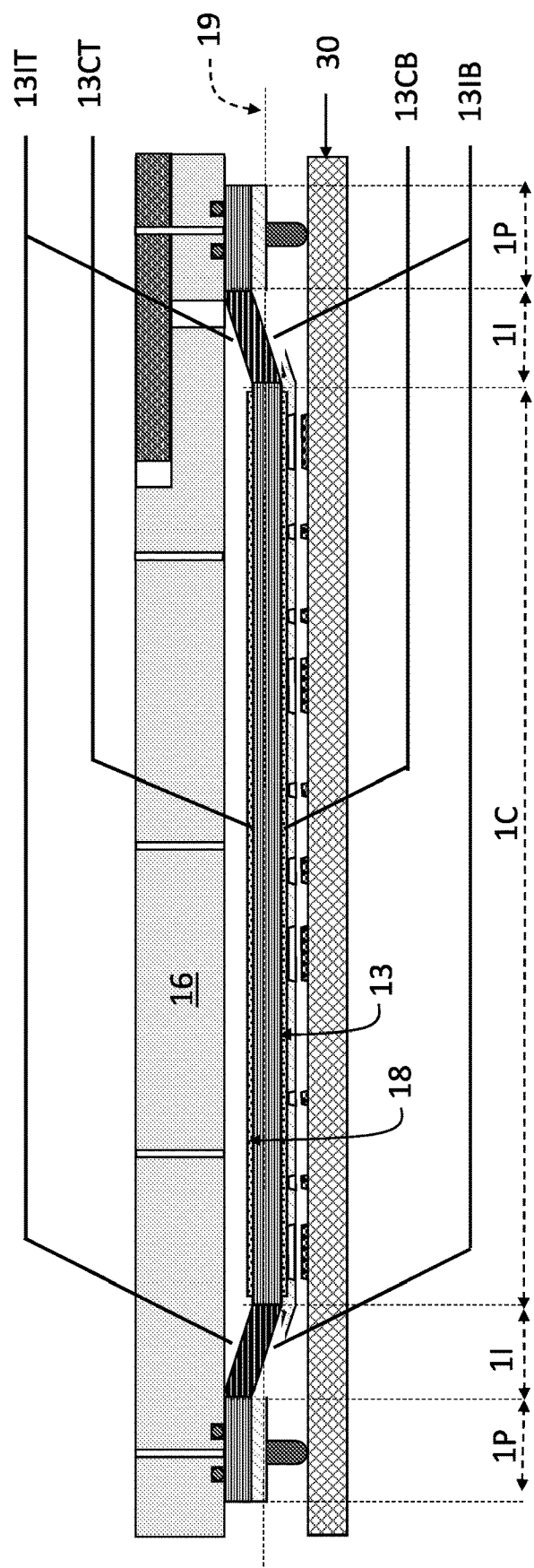
FIG. 6 shows a further embodiment of a deposition device according to the invention.

FIG. 6 shows an example of the deposition device wherein the donor plate 1 in a radially outward direction has a central section 1C, a resistively heatable intermediary section 1I and a peripheral section 1P. The central section 1C comprises a section of the flexible substrate 10, with the electrode layer 11, the first electrically insulating layer 12, the resistive heater layer 13, the second electrically insulating layer 14 and the patterned layer 15. The intermediate section 1I surrounds the central section 1C and the donor plate 1 is attached with its peripheral section 1P to the plate carrier 16. In the example shown, the central section 1C has mutually a bottom resistive heater layer 13CB and a top resistive heater layer 13CT which are arranged at mutually opposite sides of a neutral plane defined by the flexible substrate 10. The intermediary section 1I is also resistively heatable in that it has a bottom resistive heater layer 13IB and a top resistive heater layer 13IT.

By resistively heating the intermediary section 1I, the central section 1C of the donor plate can be translated towards the target without substantial deformation. Deformation of the central section 1C is further mitigated in that the bottom resistive heater layer 13CB and the top resistive heater layer 13CT are controlled to avoid a substantial temperature gradient in the central section 1C in a direction of its surface normal. Also the intermediary section 1I may have a thermal expansion coefficient greater than that of the central section 1C, for example by a local modification of the substrate. Therewith a substantial deformation of the intermediary section 1I can be achieved. In one of the examples electrodes for supplying the resistive heaters 13CB, 13CT, 13IB, 13IT may be provided from copper an be embedded in a silicon substrate. Copper has a thermal expansion coefficient of about 17 ppm/K, while silicon is around 3.3 ppm/K. Moreover, copper has a very high thermal conductivity. This has the advantage that heating/cooling and therewith expansion and retraction of the plate can be achieved even more rapidly.

Figures 7A, 7B:
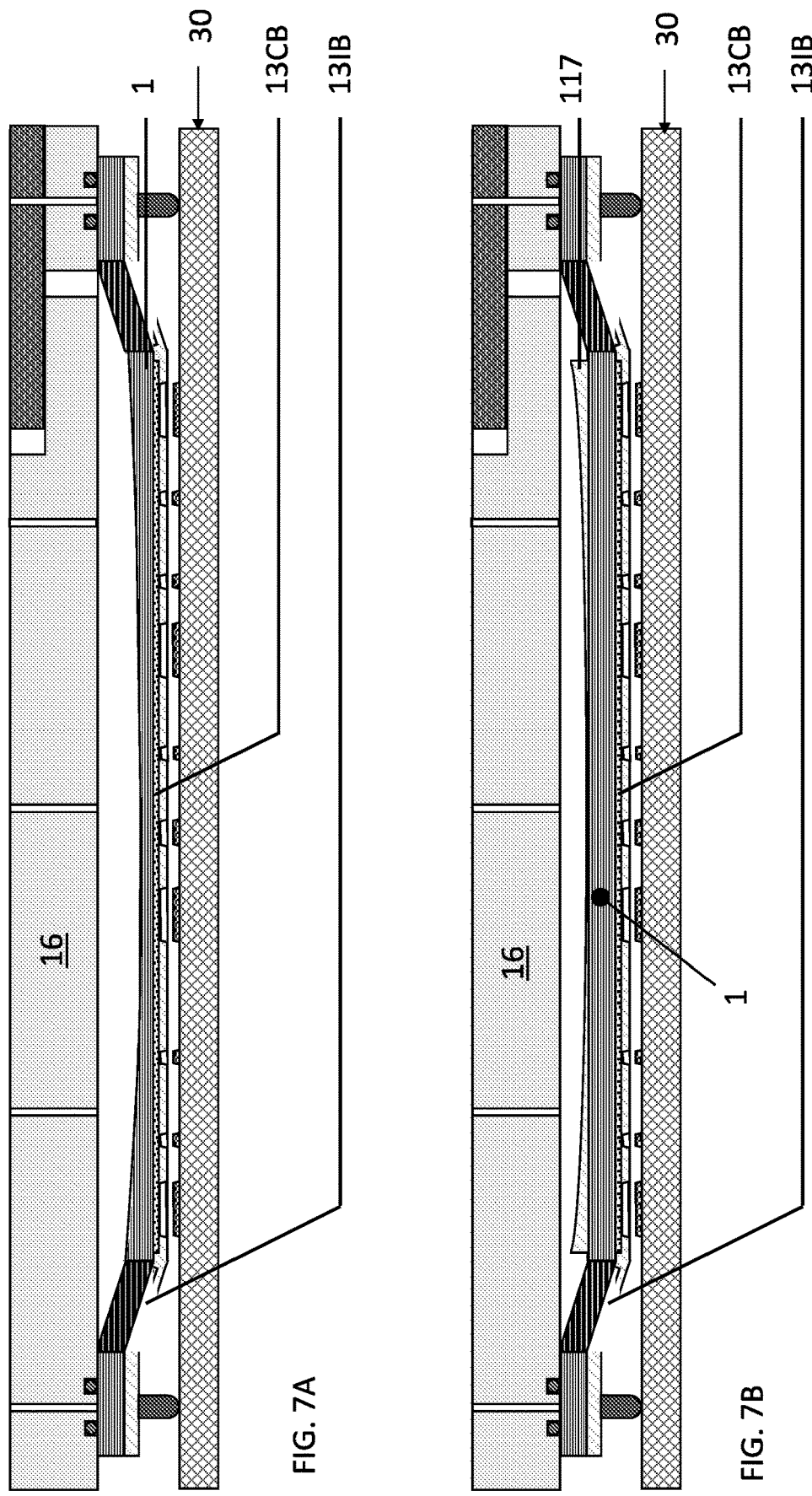
FIGS. 7A and 7B shows two further embodiments of a deposition device according to the invention.

FIGS. 7A and 7B shows two further embodiments of a deposition device. In the case of the deposition device of FIG. 7A, the deposition plate 1 has a central section 1C with a thickness that increases in a radially outward direction. This is achieved in that the flexible substrate 10 of the plate has the radially increasing thickness.

Also in the embodiment of FIG. 7B, the central section 1C has a thickness that increases in a radially outward direction. However, in this embodiment this is achieved in that a coating 117 having a low thermal conductivity and having the appropriate thickness profile is applied on the second main surface 102 of the flexible substrate 10. The flexible substrate 10 proper is of uniform thickness in this case.

The thermal equilibration time is relatively low in the center of the plate as compared to that in a more radially outward direction. As a result, a higher thermal expansion occurs in the periphery of the plate while the plate remains substantially flat in the printing area.

It is noted that one or more thermal buffer layers, e.g. from a ceramic material, such as SiO2 may be provided between the flexible substrate 10 and the resistive heater layer 13 to provide for a reduced heatflux into the substrate. Simulations were performed which are described below with reference to FIG. 8, FIG. 9A, 9B, 9C and FIG. 10A, 10B.

Figure 8:
FIG. 8 schematically shows model of a donor plate as used in a simulation.

FIG. 8 schematically shows the simulated donor plate 1 for deposition of the substance 2, in this case an ink. The donor plate is provided with a silicon substrate 10 having a thickness of 300 micron. The substrate 10 is provided with a copper electrode layer 11 at its first main surface 101 (indicated by a dashed line). The electrode layer comprises a first electrode 111 and a second electrode 112 of a complementary shape having a thickness of 50 micron that are embedded in the silicon substrate at its first main surface 101 and that are electrically insulated from each other by the material of the substrate. It is noted that not all elements in the drawing are presented at the same scale. For example, for clarity only the upper portion of the substrate 10 is shown. More details about the dimensions and the material properties used for the simulation are provided in the table below. Subsequent to the electrode layer 11, the simulated donor plate 1 comprises a first electrically insulating layer 12 of SiO2, a molybdenum resistive heater layer 13 a second electrically insulating layer 14 of Si3N4) and a patterned layer provided with one or more recesses 155 for holding the deposition substance 2 to be deposited. It is noted that FIG. 8 only shows a portion where the simulated donor plate forms a recess 155 in the patterned layer.

As shown in FIG. 8, the resistive heater layer 13 is electrically connected to each of a contact surface of the first electrode 111 and a contact surface of the second electrode 112 via a respective slit 121, 122 in the first electrically insulating layer.

FIG. 8 further shows a heat spreader layer 20 at a bottom of the recess 155. The heat spreader layer 20 is formed of tungsten and has a thickness of 1 micron.

More details are presented in the following table.

| | Thickness (µm) | Density (kg/m3) | Specific Heat (J/kgK) | Thermal conductivity (W/mK) |
|---|---|---|---|---|
| Ink | 5 | 4000 | 300 | 0.4 |
| W | 1 | 19300 | 134 | 173 |
| Si3N4 | Variable | 3170 | 673 | 3 |
| Mo | 0.13 | 10280 | 250 | 142 |
| SiO2 | 1 | 2300 | 680 | 1.1 |
| Cu | 50 | 8960 | 385 | 386 |
| Si | 300 | 2330 | 710 | 148 |

The simulation was performed with a fixed setting for the heat flux generated in the Mo layer of 150 kW/cm$^2$. The thickness of the second insulating layer 14 and the dimensions of the slits 121, 121 were variable.

Figures 9A, 9B, 9C, 10A, 10B:
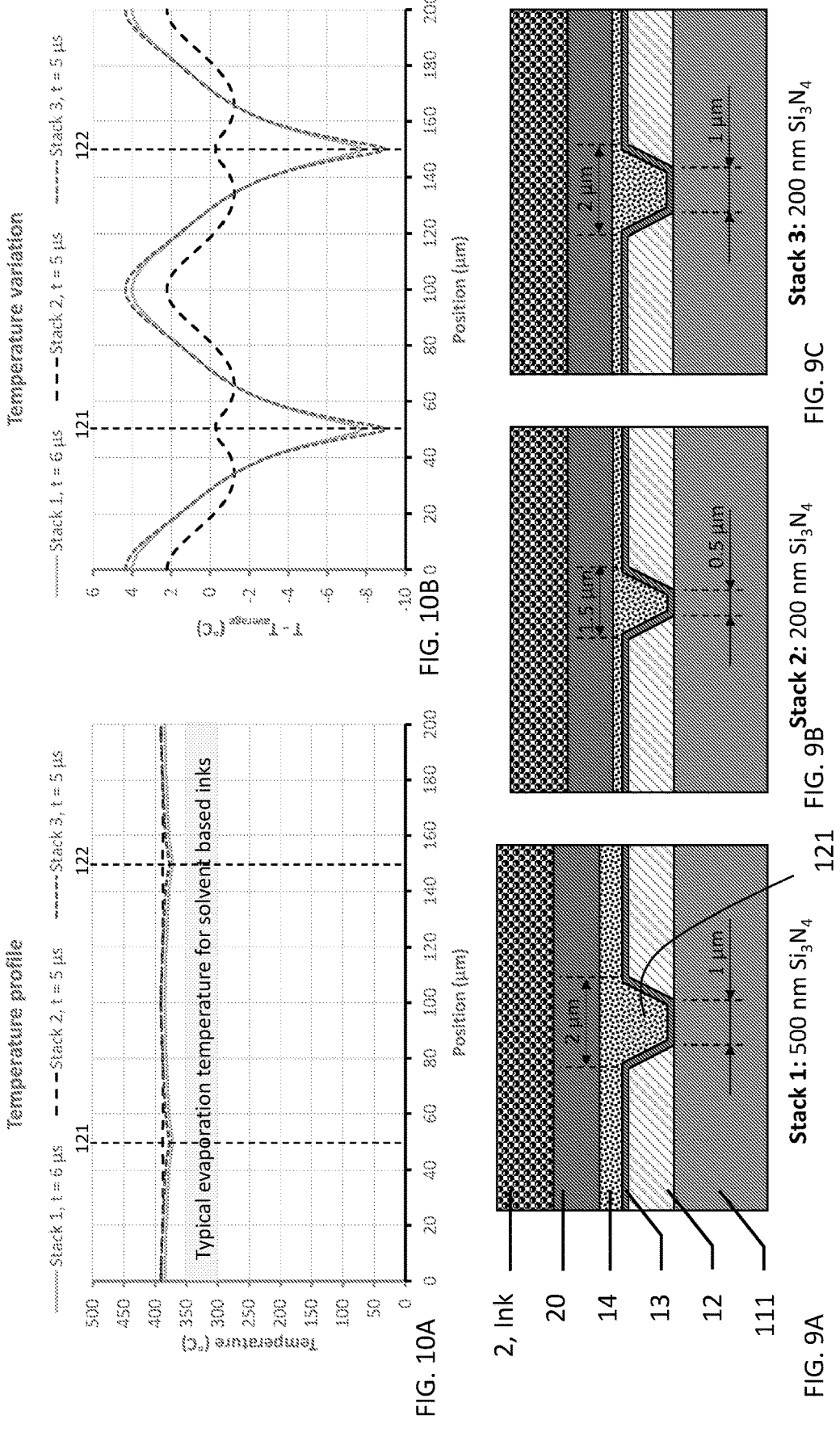
FIGS. 9A, 9B and 9C show variations of this model.
FIGS. 10A and 10B shows simulation results.

FIGS. 9A, 9B and 9C show three exemplary simulation settings denoted as Stack 1, Stack 2 and Stack 3 respectively.

In FIG. 9A the slit tapers outward in a direction away from the first electrode 111 from a smallest width of 1 micron to a largest width of 2 micron, and the second insulating layer 14 has a thickness of 500 nm.

In FIG. 9B the slit tapers outward in a direction away from the first electrode 111 from a smallest width of 0.5 micron to a largest width of 1.5 micron, and the second insulating layer 14 has a thickness of 200 nm.

In FIG. 9C the slit tapers outward in a direction away from the first electrode 111 from a smallest width of 1 micron to a largest width of 2 micron, and the second insulating layer 14 has a thickness of 200 nm. In each case the molybdenum layer 13 electrically contacts the first electrode 111 in the narrow part of the slit 121. The same applies to the electrical contact between the molybdenum layer 13 with the second electrode 112 in the slit 122. Because the electrical connections with the first and the second electrode are the same, only the electrical connection with the first electrode is shown.

FIG. 10A, 10B shows a temperature distribution in the substance for each of these cases as a function of the position from left to right in the drawing. As a reference, the positions of the slits 121, 122 are indicated. FIG. 10A shows the absolute value of the temperature, whereas FIG. 10B shows the deviation of the temperature from the average temperature. To take into account the different thickness of the second insulating layer 14 in Stack 1 on the one hand and Stacks 2,3 on the other hand, the temperature distribution of Stack 1 is determined after 6 microseconds and the temperature distribution of Stacks 2 and 3 is determined after 5 microseconds. As can best be seen in FIG. 10B, the temperature distribution of Stacks 1 and 3 closely resemble each other. The temperature distribution of Stack 2 is more uniform as compared to Stacks 1 and 3. This is explained in that the contact area of the resistive layer 13 with the electrode 111, wherein the resistive layer does not generate heat, is substantially smaller in Stack 2 than in each of Stacks 1 and 3.

As can further be observed in FIGS. 10A, 10B it is achieved that the temperature above the slits 121, 122 achieves a maximum value that is almost equal to the average temperature. This can be explained by the following. Firstly, due to the fact that the slits have slanting sidewalls, a relatively large surface is provided relative to the projection of this surface in the recess 155. Therewith the heat flux, the power per unit area, in the projection of the sidewall surface, is higher than the heat flux generated in the side walls. Secondly, depending on the deposition technique used for the resistive layer, it can be achieved that the heat flux generated in the side walls of the resistive layer is larger than the heat flux generated in the areas of the resistive layer between the slits. For example, if the resistive layer 13 is deposited by sputtering, the material for deposition is distributed on the sidewalls over a larger area than in the areas of the resistive layer between the slits. Therewith the thickness of the resistive layer at the sidewalls is less than the thickness of the resistive layer between the slits. Due the relatively high resistance of the resistive layer present on the sidewalls therein a relatively high heat flux is generated. By a proper choice of the thickness of the first insulating layer 12, and the dimensions of the tapering slits 121, 122, i.e. the width thereof at the contact-area with the electrode 111 and the width thereof at the main surface of the resistive layer, it can be achieved that the average heat flux in the projected area of the slit 121, 122 is approximately equal to the heat flux in the areas between the slits. It is noted that the heat flux in the recess can be further homogenized by a heat distribution layer 20, as shown in FIGS. 8 and 9A, 9B, 9C. The skilled person can therewith make a tradeoff between a desired extent of homogeneity and an efficiency of the device. If a high extent of homogeneity is desired, a relatively thick heat distribution layer 20 may be selected at the cost of some loss of efficiency, in that a longer heating time and more energy is required to obtain a desired average temperature. Accordingly, if the efficiency is more important, a thinner heat distribution layer 20 may be chosen.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention claimed is:

1. A donor plate for deposition of a deposition substance on a target, the donor plate comprising multiple layers, in a layered order, of:
   a flexible substrate having a first main surface;
   an electrode layer;
   a first electrically insulating layer;
   a resistive heater layer;
   a second electrically insulating layer; and
   a patterned layer provided with one or more recesses for holding deposition substance to be deposited on the target,
   wherein the electrode layer comprises a first electrode and a second electrode of a complementary shape and being electrically insulated from each other, and
   wherein the resistive heater layer is electrically connected to each of a contact surface of the first electrode and a contact surface of the second electrode via at least one respective slit in the first electrically insulating layer.

2. The donor plate according to claim 1, wherein at each position of the resistive heater layer a smallest distance between the at least one slit of the first electrode and the at least one slit of the second electrode is at most one tenth of a square root of an effective surface area of the resistive heater layer.

3. The donor plate-according to claim 2, wherein the first electrode and the second electrode are comb-shaped, wherein the first electrode has a first set of comb fingers and the second electrode has a second set of comb fingers, wherein the first set of comb fingers of the first electrode and the second set of comb fingers of the second electrode are interleaved, wherein the at least one slit of the first electrode comprises a respective slit for each comb finger of the first set of comb fingers, wherein the at least one slit of the second electrode comprises a respective slit for each comb finger of the second set of comb fingers, and wherein respective slits in the first electrically insulating layer extend in a longitudinal direction of comb fingers of the first and second sets of comb fingers over their respective contact surfaces.

4. The donor plate according to claim 2, wherein the first electrode and the second electrode extend alongside each other according to a spiral trajectory, and wherein the at least a first slit longitudinally extends over the contact surface of the first electrode and the at least one slit of the second electrode longitudinally extends over the contact surface of the second electrode.

5. The donor plate according to claim 1, further comprising respective, independently controllable sets of one or more resistive heating elements arranged between the second electrically insulating layer and the patterned layer in respective zones defined by respective ones of the one or more recesses.

6. The donor plate according to claim 5, wherein at least one independently controllable set of one or more resistive heating elements comprises at least two independently controllable resistive heating elements.

7. A deposition device, comprising:

a donor plate for deposition of a deposition substance on a target, the donor plate comprising multiple layers, in a layered order, of:

a flexible substrate having a first main surface;

an electrode layer;

a first electrically insulating layer;

a resistive heater layer;

a second electrically insulating layer; and a patterned layer provided with one or more recesses for holding deposition substance to be deposited on the target, wherein the electrode layer comprises a first electrode and a second electrode of a complementary shape and being electrically insulated from each other, and wherein the resistive heater layer is electrically connected to each of a contact surface of the first electrode and a contact surface of the second electrode via at least one respective slit in the first electrically insulating layer; and a plate carrier, wherein the donor plate is laterally attached at a second main surface, opposite the first main surface, to a first plate carrier surface of the plate carrier.

8. The deposition device according to claim 7, wherein the plate carrier is mounted to a reference frame at a first side, and wherein the plate carrier is, at a second side opposite the first side, slidably coupled to the reference frame to allow the plate carrier to expand in a direction along an axis from the first side to the second side.

9. The deposition device according to claim 7, wherein the donor plate is fixed to the plate carrier with a round going seal, wherein the plate carrier has one or more channels extending through the plate carrier, which and wherein the one or more channels are configured to be coupled to a pressure control unit.

10. The deposition device according to claim 7, comprising one or more spacers at a free surface of the patterned layer.

11. The deposition device according to claim 7, wherein the donor plate, in a radially outward direction, has a central section, a resistively heatable intermediary section, and a peripheral section;

wherein the central section comprises a section of the flexible substrate, with the electrode layer, the first electrically insulating layer, the resistive heater layer, the second electrically insulating layer and the patterned layer, wherein the intermediate section surrounds the central section, and wherein the donor plate is attached at the peripheral section to the plate carrier.

12. The deposition device according to claim 11, wherein the resistively heatable intermediary section has a thermal expansion coefficient greater than a thermal expansion coefficient of the central section.

13. The deposition device according to claim 11, wherein the resistively heatable intermediary section comprises a plurality of heating layers.

14. The deposition device according to claim 11, wherein the central section comprises a further resistive heater layer, and wherein the resistive heater layer and the further resistive heater layer are arranged at opposite sides of a virtual central plane of the central section.

15. The deposition device according to claim 11, wherein a thickness of the central section increases in a radially outward direction.

16. The deposition device according to claim 7, wherein at each position of the resistive heater layer a smallest distance between the at least one slit of the first electrode and the at least one slit of the second electrode is at most one tenth of a square root of an effective surface area of the resistive heater layer.

17. The deposition device according to claim 16, wherein the first electrode and the second electrode are comb-shaped, wherein the first electrode has a first set of comb fingers and the second electrode has a second set of comb fingers, wherein the first set of comb fingers of the first electrode and the second set of comb fingers of the second electrode are interleaved, wherein the at least one slit of the first electrode comprises a respective slit for each comb finger of the first set of comb fingers, wherein the at least one slit of the second electrode comprises a respective slit for each comb finger of the second set of comb fingers, and wherein respective slits in the first electrically insulating layer extend in a longitudinal direction of comb fingers of the first and second sets of comb fingers over their respective contact surfaces.

18. The deposition device according to claim 16, wherein the first electrode and the second electrode extend alongside each other according to a spiral trajectory, and wherein the at least a first slit longitudinally extends over the contact surface of the first electrode and the at least one slit of the second electrode longitudinally extends over the contact surface of the second electrode.

19. A method of depositing using a donor plate, wherein the donor plate comprises multiple layers, in a layered order, of:

a flexible substrate having a first main surface;

an electrode layer;

a first electrically insulating layer;

a resistive heater layer;

a second electrically insulating layer; and a patterned layer provided with one or more recesses for holding deposition substance to be deposited on the target, wherein the electrode layer comprises a first electrode and a second electrode of a complementary shape and being electrically insulated from each other, and wherein the resistive heater layer is electrically connected to each of a contact surface of the first electrode and a contact surface of the second electrode via at least one respective slit in the first electrically insulating layer, and wherein the method comprises:

positioning the donor plate with its patterned layer in a non-contacting manner in front of the target;

substantially uniformly heating the donor plate with the resistive heater layer to therewith deform the donor plate to cause the patterned layer to move towards the target;

ejecting the deposition substance to be deposited from the recesses onto the target; and cooling down the donor plate to remove the patterned layer from the target.

20. The method according to claim 19, wherein the donor plate has respective, independently controllable sets of one or more resistive heating elements arranged between the second electrically insulating layer and the patterned layer in respective zones defined by respective ones of the recesses, and wherein the method further comprises independently controlling the step of ejecting by providing electric energy to said respective, independently controllable sets of one or more resistive heating elements.

*    *    *    *    *